United States Patent [19]

Saito et al.

[11] Patent Number: 4,857,482

[45] Date of Patent: Aug. 15, 1989

[54] METHOD OF FORMING BUMP ELECTRODE AND ELECTRONIC CIRCUIT DEVICE

[75] Inventors: Masayuki Saito; Akira Niitsuma, both of Yokohama; Hirosi Ohdaira, Chigasaki; Chiaki Tanuma, Tokyo; Miki Mori, Kawasaki, all of Japan

[73] Assignee: Kabushiki Kaisha Toshiba, Kawasaki, Japan

[21] Appl. No.: 213,249

[22] Filed: Jun. 29, 1988

[30] Foreign Application Priority Data

Jun. 30, 1987 [JP] Japan .................................. 62-163084
Aug. 13, 1987 [JP] Japan .................................. 62-200777
Mar. 31, 1988 [JP] Japan .................................. 63-78781

[51] Int. Cl.$^4$ ............................................. H01L 21/68
[52] U.S. Cl. ........................................ 437/209; 29/837; 29/739; 206/329; 264/272.11; 357/74
[58] Field of Search ...................... 437/209, 206, 207; 29/837, 739; 206/329; 264/272.11; 357/74

[56] References Cited

FOREIGN PATENT DOCUMENTS

56-60027 5/1981 Japan.

Primary Examiner—Brian E. Hearn
Assistant Examiner—Beverly A. Pawlikowski
Attorney, Agent, or Firm—Oblon, Spivak, McClelland, Maier, & Neustadt

[57] ABSTRACT

A support is formed and comprises a base, a resin layer which is formed on the base and on recesses which are formed on a surface of the base, and a conductive layer which is formed on a portion of a surface of the resin layer, other than where the recesses are formed. The surface of the recesses is electrically charged by way of a corona discharge to create static electricity in the recesses. Metal balls to be formed into bump electrodes are held in the recesses by way of the static electricity. Then, each of the metal balls is bonded to a corresponding electrode terminal of an electronic component by hot press unit while the electronic component is opposed to the support.

16 Claims, 6 Drawing Sheets

METHOD OF FORMING BUMP ELECTRODE AND ELECTRONIC CIRCUIT DEVICE

BACKGROUND OF THE INVENTION

1. Field of the Invention

The present invention relates to a method of forming bump electrodes on electrode terminals of an electronic component such as a semiconductor element, a passive element, and an electronic circuit module for electrically connecting the electrode terminals with a conductive pattern formed on a wiring board, and an electronic circuit device which is manufactured by utilizing this bump electrode forming method, and which comprises a printed wiring board having an electronic circuit module mounted thereon.

2. Description of the Related Art

In the field of semiconductor integrated circuits, a semiconductor element having more than 100 terminals has been developed as a result of improvements achieved in the field of integration density of semiconductor elements. As a result of the trend toward greater integration density, demand has grown for the development of a technique for efficiently bonding such high-density integrated circuits to a conductive pattern of a wiring board.

In response to this demand, a number of techniques have been developed whereby a large number of electrode terminals of a semiconductor element are collectively bonded to a conductive pattern formed on a wiring board. One such technique is the flip-tip technique, according to which a plurality of electrode terminals are formed on a surface of a semiconductor element, the electrode terminal formation surface of the semiconductor element is placed to face a bonding conductive pattern of a wiring board, and the electrode terminals and the conductive pattern are connected to each other through bump electrodes. Using the flip-tip technique bump electrodes can be formed by way of either one of the two following methods:

According to the first method, a laminated film of Cr/Cu/Au or Ti/Ni/Au is formed on electrode terminals of a semiconductor element by vacuum evaporation and PEP (photo etching process), and then a Pb-Sn alloy solder layer is formed on this laminated film by plating. According to the second method, a Pb-Sn alloy solder layer is formed on connection terminals of a conductive pattern on a wiring board by printing or plating.

These methods, however, require complex processes and high manufacturing costs, and moreover, many defective products tend to be manufactured, especially in the case of the first method, since PEP is required for each wafer. In addition, since each of these methods a entails the formation of a solder layer, by plating or printing, it is difficult to obtain a uniform thickness of this layer, and hence the heights of bump electrodes become nonuniform.

Figure 1A:
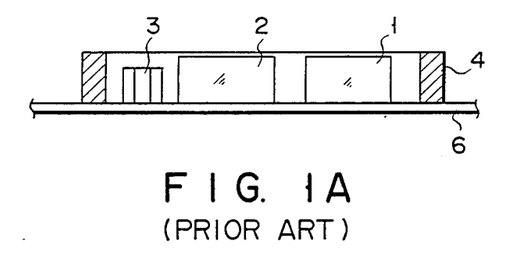
FIGS. 1A to 1C are sectional views showing a process of manufacturing a conventional electronic module.
Figure 1B:
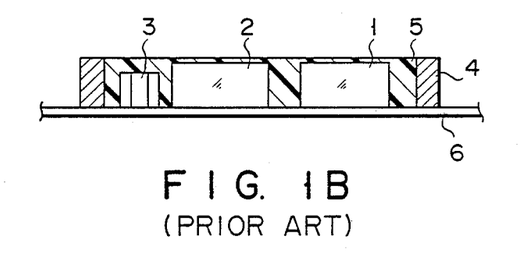
Figure 1C:
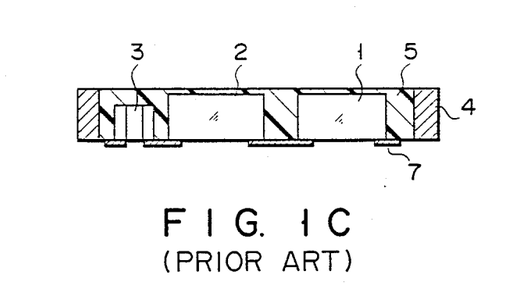

Recently, with a demand for a higher integration density of electronic equipment, an electronic circuit module incorporating semiconductor elements and passive elements such as chip capacitors is used. As a method of manufacturing such an electronic circuit module, a method shown in FIGS. 1A to 1C is known ("Planar LSI interconnection method utilizing polymeric conductor" IMC. Proc. 1986).

In this method, for example, semiconductor elements 1 and 2, and passive element 3 such as a chip capacitor are face-die-mounted onto determined positions within frame body 4 mounted on base member 6 (FIG. 1A). Then, liquid resin 5 is charged into spaces between elements 1 to 3 and frame body 4, and is cured (FIG. 1B). Subsequently, frame body 4 and elements 1 to 3 are separated from base member 6, and a conductive paste such as Ag paste is screen-printed on these elements to simultaneously form wiring for connecting electrodes 7 to the respective elements (FIG. 1C). In this method, since wiring is formed on the surfaces of the elements after the elements are buried in the resin, a thin-profile electronic circuit module can be obtained. In addition, multilayer wiring can be formed, and high-density mounting can be performed, thereby obtaining an extremely compact electronic circuit module.

When a large electronic circuit apparatus is formed by a plurality of such electronic circuit modules or a combination of these modules and other electronic circuit modules, the electronic circuit modules are mounted on a printed board. In this case, a method of connecting the electrode terminals of the electronic circuit modules to the electrodes on the printed board using an anisotropic conductive adhesive sheet obtained by dispersing a solder powder or Ni powder in an organic polymer can be employed.

In such a method, however, since the solder powder or the Ni powder is dispersed in the anisotropic conductive adhesive sheet at random, in order to reliably connect the electrode terminals of the electronic circuit modules to the electrodes of the printed board, the electrode terminals and the electrodes must be increased in size. Since a uniform pressure is not applied to each electrode during the adhesive bonding because of the nonuniform particle diameter of the solder powder or the Ni powder, a stable junction resistance cannot be obtained. In the worst case, the electrodes may be destroyed by the bonding pressure. Furthermore, since the solder powder or the Ni powder cannot be heated to its melting point from the viewpoint of the prevention of heat deterioration of the resin in the electronic circuit modules, the conduction between the anisotropic conductive adhesive sheet, continuity between the electrode terminals of the electronic circuit modules and the electrodes of the printed wiring board is maintained simply by contact. Therefore, a junction failure may be caused due to spring back of a binder resin present in the electronic circuit modules and the adhesive sheet.

SUMMARY OF THE INVENTION

It is an object of the present invention to provide a highly efficient method of forming bump electrodes on an electronic component such as a semiconductor element.

It is another object of the present invention to provide a method of forming bump electrodes, in which a plating process is not required, and bump electrodes of uniform height can be obtained.

According to the present invention, either of the above bump electrodes can be formed by means of any one of the following three methods:

A first method of forming bump electrodes according to the present invention is one in which a bump electrode is formed on an electrode terminal of an electronic component, and comprises the steps of: preparing a support having a recess formed in a surface portion thereof, at a position corresponding to the electrode terminal, electrically charging the recess of the support, to create static electricity in said recess; placing a particulate metal member in the recess, the metal member being retained therein by way of the static electricity; and bonding the electrode terminal to the particulate metal member while the electronic component is opposed to the support.

A second method of forming a bump electrode according to the present invention is one in which a bump electrode is formed on an electrode terminal of an electronic component including a semiconductor element, and comprises the steps of: preparing a support having a recess formed in a surface portion thereof, at a position corresponding to the electrode terminal; electrically charging the recess of the support, to create static electricity in the recess; placing a particulate metal member in the recess, the metal member being retained therein by way of said static electricity; eliminating the electrical charges held within the particulate metal member, and bonding the electrode terminal to the particulate metal member while the electronic component is opposed to the support.

A third method of forming a bump electrode according to the present invention is one in which a bump electrode is formed on an electrode terminal of an electronic component, and comprises the steps of: preparing a support having a photoconductive layer on a surface portion thereof; electrically charging a surface of the photoconductive layer, exposing to light, an area on the surface of the photoconductive layer, other than an area corresponding to the electrode terminal, to eliminate electrical charges held within the exposed area; placing a particulate metal chamber on a non-exposed area of the surface of the photoconductive layer, the metal chamber being retained thereon by way of the static electricity; and bonding the electrode terminal to the particulate metal member while the electronic component is opposed to the support.

It is a further object of the present invention to provide an electronic circuit device having high reliability as regards connection between an electronic circuit module and a printed wiring board.

An electronic circuit device according to the present invention comprises a printed wiring board having electrodes formed on a surface thereof, an electronic circuit module having a plurality of electronic components including semiconductor elements buried in a resin, and electrode terminals which consist of a conductive paste and are formed on the electronic components, and particulate metal members for connecting the electrodes of the printed board to the electrode terminals of the electronic circuit module.

DETAILED DESCRIPTION OF THE PREFERRED EMBODIMENTS

Embodiments of the present invention will now be described below; with reference to the accompanying drawings.

Figure 2:
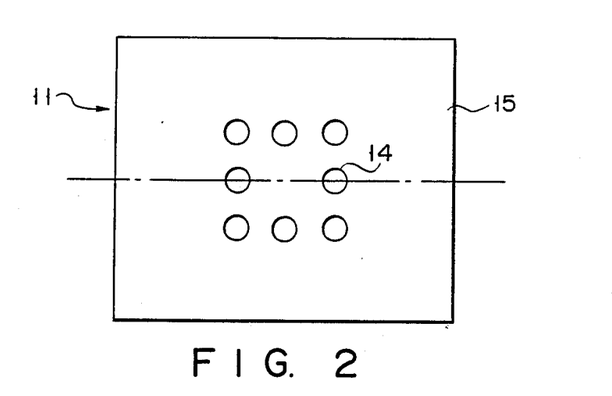
FIG. 2 is a plan view of a support used in a method of forming bump electrodes according to a first embodiment of the present invention.
Figure 3:
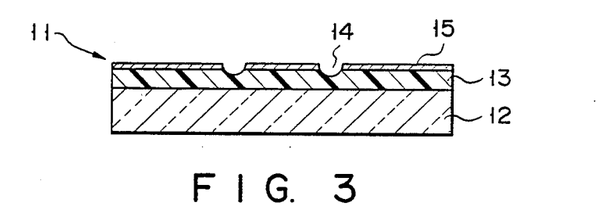
FIG. 3 is a sectional view of the support shown in FIG. 2.

FIG. 2 is a plan view of a support used in a method of forming bump electrodes according to a first embodiment of the present invention, and FIG. 3 is a sectional view taken along line III—III of FIG. 2. Support 11 comprises base 12, resin layer 13 formed thereon, and conductive layer 15 formed on resin layer 13. Recesses 14 are formed in resin layer 13, at positions corresponding to electrode terminals of an electronic component. Conductive layer 15 is formed on a surface of resin layer 13, except for those positions at which recesses 14 are formed.

Base 12 which can be made of glass, ceramic, or plastics, has a size of, for example, 50×50×1.0 (mm), and should preferably be transparent so as to facilitate positioning of the electrode terminals of the electronic component. For this reason, glass is the most preferable of the above-described materials for use in its construction.

Resin layer 13 can be made of polyimide resin, epoxy resin, arcylic resin, teflon, polyester resin, polycarbonate resin, polyethylene terephthalate resin, polyvinyl chloride, or the like, and is either coated on base 12 or adhered thereto in the form of a film.

Conductive layer 15 is a thin conductive film, and can be made of a metal such as Al, Au, Ag, Ni, Fe, or Cu, a conductive metal oxide such as ITO (indium tin oxide) $In_2O_3$ or $SnO_2$, or a mixture composed of a resin binder such as epoxy, phenolic, polyimide, or polyester resin, and a metal such as Ag, C, Cu, Al, Fe, or Ni. Like base 12, resin layer 13 and conductive layer 15 should preferably be transparent, so as to facilitate positioning of the electrode terminals of the electronic component. A process of manufacturing the support having such an arrangement will now be described below.

First a photosensitive polyimide resin is coated on base 12 by way of the spinner method, and is pre-baked in a nitrogen atmosphere at 80° C. for 2 to 3 hours. Then, the polyimide resin layer is exposed to light, using a mask corresponding to a bump electrode pattern, and the exposed portions removed. Thereafter, the resultant structure is sequentially post-baked in a nitrogen atmosphere at 150° C. for 30 minutes, at 250° C. for 30 minutes, and at 400° C. for 30 minutes. With this process, resin layer 13 having recesses 14 is formed. In this case, the thickness of the photosensitive polyimide resin layer can be appropriately set in accordance with the size of a bump electrode, i.e., the size of a metal ball, which will be described later. For example, if the metal ball has a diameter of 100 μm, the thickness of the layer is set to be 20 to 80 μm. Then, conductive layer 15 is formed on a surface of resin layer 13 except for the positions of recess formation areas. When conductive layer 15 is to be formed, for example, Al is deposited on resin layer 13 by vacuum evaporation, and then a photosensitive resist is coated on the resultant structure. The resist is exposed using a mask corresponding to recesses 14, and then Al in recesses 14 is removed by etching. Note that the area of the opening of each recess 14 is preferably larger than that of its bottom area.

A method of forming pump electrodes using the above-described support will be described below.

Figure 4A:
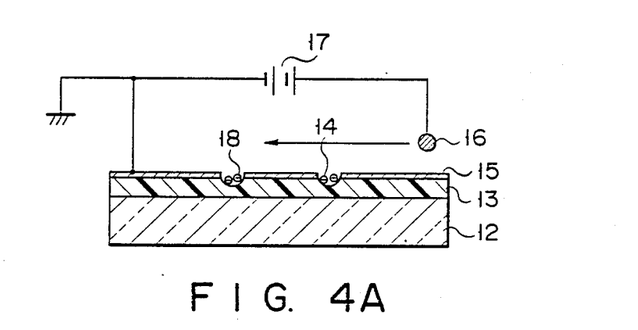
FIGS. 4A to 4D are sectional views showing a process forming part of the method of forming bump electrodes according to the first embodiment of the present invention.

FIGS. 4A to 4D are sectional views showing each step of a method of manufacturing bump electrodes according to the first embodiment of the present invention. Tungsten wire 16 having a diameter of 0.1 mm is placed, e.g., about 10 mm above support 11, and a DC voltage of 4 to 8 kV is applied to tungsten wire 16 from power source 17 to cause a corona discharge and charge the surface of support 11 (FIG. 4A). In this case, when conductive layer 15 is grounded as shown in FIG. 4A, since insulative resin layer 13 is exposed in recesses 14, only the interiors of recesses 14 are charged, and hence charges 18 are present in recesses 14.

Figure 4B:
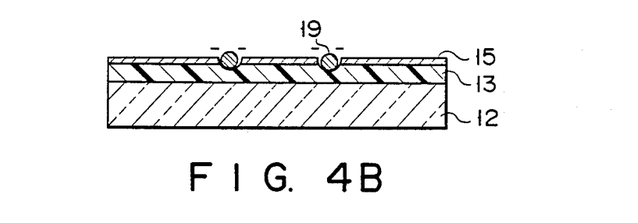

Subsequently, particulate metal, e.g., metal balls are spread over the surface of support 11, and metal balls 19 to be formed into bump electrodes are held in recesses 14 by static electricity (FIG. 4B). A proper diameter of each metal ball 19 is 50 μm or more, and is selected in accordance with the size of an electrode terminal of an electronic part. For example, if the size of the electrode terminal is 100×100 μm, the diameter of metal ball 19 is set to be 50 to 100 μm. If it is 200×200 μm, the proper size is 100 to 200 μm. Ag, Au, Al, Cu, Ni, Sn, Pb, In, Sb, Zn, Bi, Cd, an alloy of these metals, or the like can be used as a material of metal ball 19. Especially, Pb-Sn and In-Ag alloys are preferable because they can be bonded at a temperature as low as 150° C.

Figure 4C:
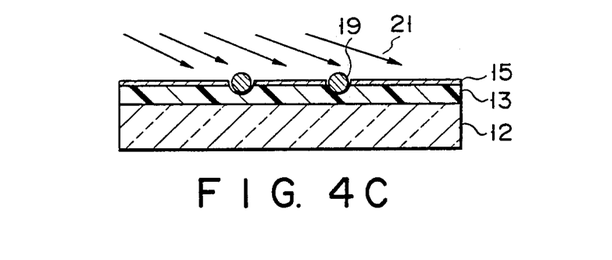

An electronic component on which bump electrodes are to be formed includes a semiconductor element, a passive element such as a capacitor, and an electronic circuit module incorporating a plurality of such elements. When an electronic component including a semiconductor element is to be used as the electronic part, since metal balls 19 are charged in the state shown in FIG. 4B, if metal balls 19 and the semiconductor element are directly bonded to each other, the semiconductor element may be broken by static electricity. For this reason, when an electronic component including a semiconductor element susceptible to such breakage is to be used, charges 20 are removed from metal balls 19 by ion blow 21 (FIG. 4C). The charges may be eliminated by bringing metal balls 19 into contact with the earth electrode without using the ion blow. Note that if an electronic component which is not susceptible to such breakage is used, this step is not necessary.

Figure 4D:
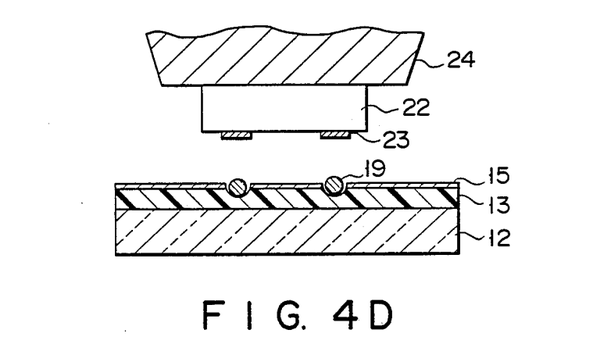

Subsequently, a surface of electronic part 22, on which electrode terminals 23 are formed, is placed opposite to support 11, and metal balls 19 are aligned with the corresponding electrode terminals to which the metal balls are to be bonded. In this state, metal balls 19 are bonded to corresponding electrode terminals 23 using hot press unit 24 (FIG. 4D). Bump electrodes are formed on electronic component 22 in this manner. In this case, although a bonding condition varies depending on the melting point of metal ball 19, if, for example, In or its alloy having a melting point of about 160° C. is used, hot pressing can be performed at 100° to 150° C. and 50 to 100 kg/cm². During bonding step, in view of stability and reliability of bonding, the support 11 or electronic component 22 may be performed ultrasonic vibration where necessary.

If the bump electrodes are formed in the above-described manner, a uniform height of the bump electrodes can be obtained because they are determined by the diameter of the metal ball. Thus, the height can be set to be, e.g., 50±3 μm. Since support 11 can be repeatedly used in the steps of FIGS. 4A to 4D, processes such as vacuum evaporation and PEP are not required for each step unlike in the conventional method, and hence productivity is very high. In addition, since vacuum evaporation and PEP for forming bump electrodes are totally unnecessary for the electronic part, the damage to the electronic part can be minimized.

Figure 5:
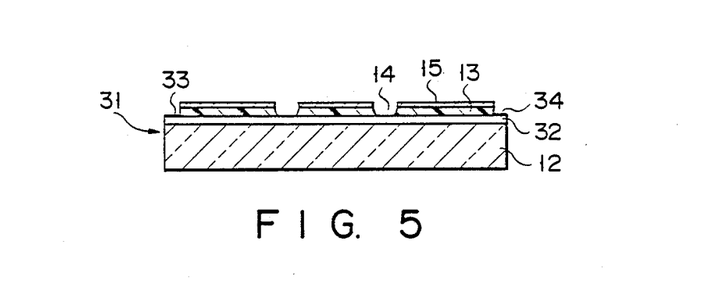
FIG. 5 is a sectional view of a support used in a modification of the first embodiment.

When the electronic component on which bump electrodes are formed includes a semiconductor element, a support shown in FIG. 5 may be used. This support 31 is constituted by photoconductive layer 32 formed between base 12 and resin layer 13 of support 11 shown in FIG. 3, and electrodes 33 and 34 formed on both ends of photoconductive layer 32. Photoconductive layer 32 can be made of a photosensitive material such as amorphous silicon, selenium, cadmium sulfide, or polyvinylcarbazole, and has a thickness of, e.g., about 5000 Å. When bump electrodes are formed using support 31, metal balls 19 are held in recesses 14 by static electricity in the same manner as in the steps of FIGS. 4A and 4B.

Figure 6:
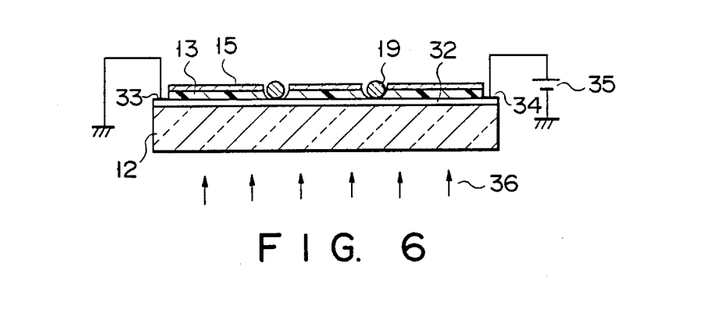
FIG. 6 is a sectional view showing a modification of the process shown in FIG. 4C.

Then, in order to remove charges 20 from metal balls 19, as shown in FIG. 6, DC power source 35 having, e.g., 1.5 V is connected to electrode 33, and light is radiated from the lower surface side of base 12 having transparency while electrode 34 of the other end side is grounded. Upon light radiation, photoconductive layer 32 is rendered conductive, and charges of metal balls 19 are eliminated through photoconductive layer 32. Then, bump electrodes can be formed on the respective terminals in the same manner as described in the step of FIG. 4D. In this case, the same effect as in the case wherein the bump electrodes are formed in the steps of FIGS. 4A to 4D can be obtained.

Figure 7:
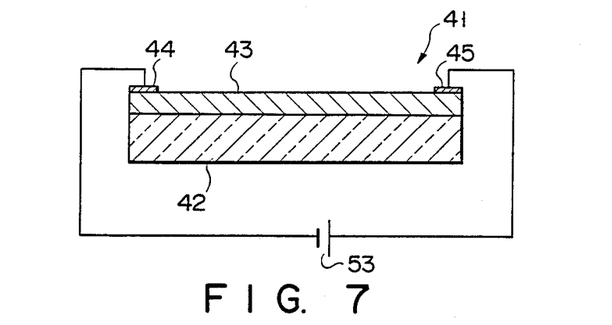
FIG. 7 is a sectional view of a support used in a method of forming bump electrodes according to a second embodiment of the present invention.

A method of forming bump electrodes according to a second embodiment of the present invention will be described below. FIG. 7 is a sectional view of a support used in the method of forming bump electrodes according to the second embodiment of the present invention. Support 41 comprises base 42, photoconductive layer 43 formed thereon, and electrodes 44 and 45 formed on both the end portions of a surface of layer 43.

Base 42 can be made of the same type of material as used for base 12. The material preferably has transparency, and especially glass is preferable. Base 12 has a size of, e.g., 50×50×1.0 (mm).

Photoconductive layer 43 can be made of a photosensitive material such as amorphorous silicon, selenium, cadmium sulfide, or polyvinylcarbazole, and can be formed to have a thickness of, e.g., about 0.5 μm.

Power source 53 is connected to electrodes 44 and 45 to discharge photoconductive layer 43 upon formation of bump electrodes, which will be described later.

A method of forming bump electrodes using such a support will be described below.

Figure 8A:
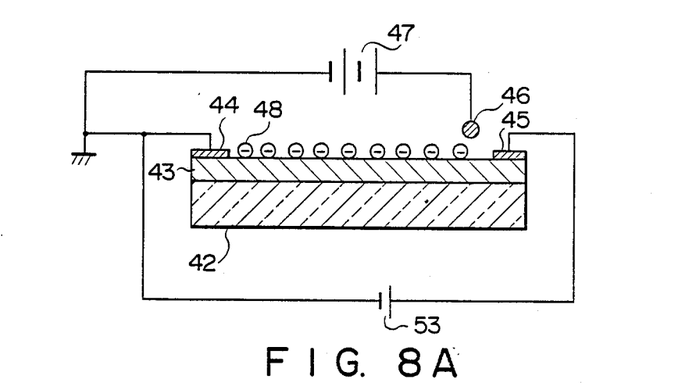
FIGS. 8A to 8D are sectional views showing a process forming part of the method of manufacturing bump electrode according to the second embodiment of the present invention.

FIGS. 8A to 8D are sectional views showing the respective steps of the method of forming bump electrodes according to the second embodiment of the present invention. Tungsten wire 46 having a diameter of 0.1 mm is placed, e.g., about 10 mm above support 41. A DC voltage of, e.g., 6 kV is applied to tungsten 46 using power source 47 to cause discharge, thereby charging the surface of photoconductive layer 43 (FIG. 8A). With this process, charges 48 are present on the surface of the photoconductive layer 43.

Figure 8B:
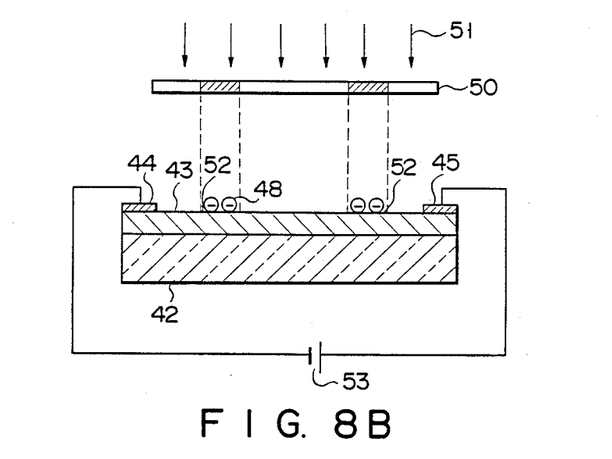

Subsequently, pattern mask 50 corresponding to electrode terminals of an electronic component on which bump electrodes are to be formed is located above support 41. Photoconductive layer 43 is irradiated with light 51 through pattern mask 50 (FIG. 8B). In this case, positive type mask 50 is used so as to shield areas corresponding to the electrode terminals of the electronic part from light. As a result, the conductivity of the area except for areas 52 corresponding to the electrode terminals of photoconductive layer 43 is rapidly increased and charges 48 in that area are eliminated, whereas charges 48 in areas 52 are left because light 51 is not radiated.

Figure 8C:
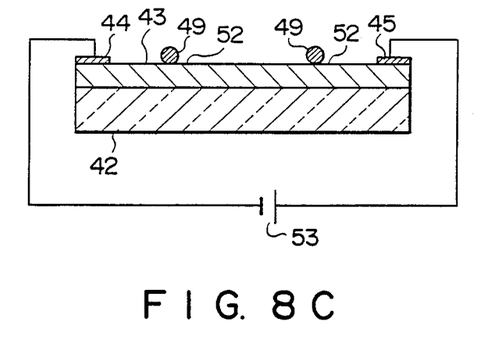

Metal balls 49 are spread over the surface of photoconductive layer 43, and areas 52 are caused to attract metal balls 49 using static electricity (FIG. 8C). Similar to the first embodiment, a proper diameter of each metal ball 49 is 50 μm or more, and is selected in accordance with the size of each electrode terminal of the electronic part. In addition, similar to the first embodiment, Ag, Au, Al, Cu, Ni, Sn, Pb, In, Sb, Zn, Bi, Cd, an alloy of these metals, or the like can be used as the material of metal ball 49.

Figure 8D:
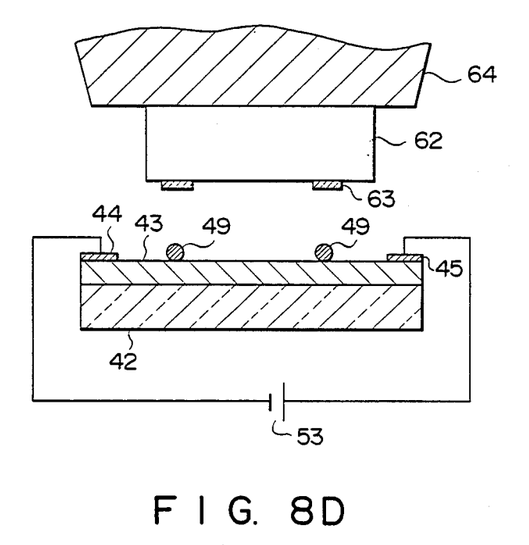

Subsequently, similar to the first embodiment, the surface having electrode terminals 63 formed thereon is placed to oppose support 41. The metal balls 49 are aligned with the corresponding electrode terminals to which the metal balls are to be bonded. In this state, metal balls 49 are bonded to corresponding electrode terminals 63 using hot press unit 64 (FIG. 8D). Bump electrodes are formed on electronic part 62 in this manner. In this case, the boding condition is the same as in the first embodiment.

After this step, photoconductive layer 43 is discharged using power source 53 for the next bump electrode formation.

By forming the bump electrodes in this manner, the same effect as in the first embodiment can be obtained. Furthermore, in this embodiment, in order to locate the metal balls at the predetermined positions of the support, light is simply radiated through a mask. Therefore, bump electrodes can be formed on an electronic component of a different type by only changing the mask, and hence the productivity is very high.

Figure 9:
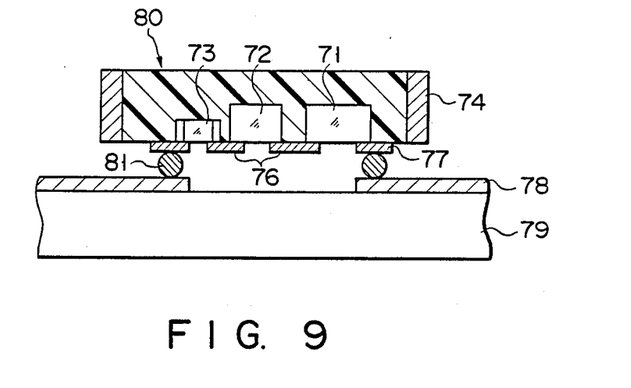
FIG. 9 is a sectional view of an electronic circuit device according to an embodiment of the present invention.

An electronic circuit device according to the present invention will be described below. FIG. 9 is a sectional view of an electronic circuit device according to an embodiment of the present invention. Referring to FIG. 9, electronic circuit module 80 comprises frame body 74, semiconductor elements 71 and 72, and passive element 73 such as a capacitor arranged in frame body 74 while being buried in a resin, and wires 76 and electrode terminals 77 formed on the lower surfaces of the respective elements. Each of wires 76 and electrode terminals 77 is made of an organic polymer binder and a metal power filler. As the binder, one or more types of materials is/are used, which is/are selected from thermosetting resins such as epoxy, phenolic, silicone, polyimide, arcylic, and 1-2 polybutadiene resins, or thermoplastic resins such as polycarbonate, polyvinyl chloride, polyethylene sulfide, and polystyrene resins. A powder such as Au, Ag, Cu, Fe, Ni, Sn, and Pb powders can be used as the metal filler. An Ag or Cu powder is suitable in terms of resistance to oxidation and cost. An antioxidant may be added as needed. Wires 76 and electrode terminals 77 can be formed by screen printing. In this case, a paste prepared by mixing, e.g., 10 parts by weight of epoxy resin, 80 parts by weight of an Ag powder having a mean particle diameter of 5 μm, and 30 parts by weight of butylcarbitol acetate as a solvent is screen-printed, and then is heated at 120° C. for 30 minutes to be cured.

The electronic circuit device of this embodiment comprises one or more electronic circuit modules 80 described above, and printed wiring board 79 on which these modules are mounted. Electrode terminals 77 of each electronic circuit module 80 and corresponding electrodes 78 of printed wiring board 79 are connected to each other by corresponding spherical electrodes 81.

As printed wiring board 79, a board obtained by printing a conductive resin coating on, e.g., a glass epoxy plate, a paper phenolic plate, a polyimide plate, a polyester plate, a metal core printed wiring board, or a resin film is used. A wiring layer and electrodes 78 formed on printed board 79 are made of a copper foil, a silver paste, a copper paste, a gold paste, or a carbon paste.

A method of manufacturing such an electronic circuit device will be described below. Electronic circuit module 80 is formed by the above-described known method. Then, metal balls are bonded to electrode terminals 79 in substantially the same manner as in the above-described method of forming bump electrodes, thereby forming spherical electrodes 81. That is, spherical electrodes 81 can be formed by the same process as shown in FIGS. 4A to 4D, 6, and 8A to 8D using such a support as shown in FIGS. 2, 3, 5, and 7.

As the metal balls used in this process and formed into spherical electrodes 81, any metal balls can be used as long as they have a low melting point and a uniform size, as described above. Especially, metal balls containing In and Ag are preferable, and may contain other metals such as Sn, Pb, Sb, and Cd. Since the solid phase temperature of an alloy can be decreased by containing In, the metal balls can be bonded without thermally deteriorating electronic circuit module 80 containing a resin as a constituent element. In addition, since Ag is an element easily diffused in a different metal, bonding reliability can be improved by containing Ag. When a material containing an Ag filler as a basic ingredient is used for electrode terminals 77, bonding reliability can be further improved because the metal balls contain the same type of metal as electrode terminals 77. In this case, the bonding conditions of the metal balls vary depending on the melting point of the metal balls. For example, an alloy (having a melting point of 141° C.) consisting of 90 parts by weight of In and 10 parts by weight of Ag is used, it is suitable for the alloy to be bonded at a temperature lower than the melting point, e.g., 110° to 140° C. at a pressure of 50 to 100 kgf/cm$^2$. When an alloy consisting of 36 parts by weight of Pb, 36 parts by weight of Sn, 25 parts by weight of In, and 3 parts by weight of Ag is used, suitable conditions are about 120° C. and 10 kgf/cm$^2$.

Subsequently, spherical electrodes 81 bonded to electrode terminals 77 are bonded to corresponding electrodes 78 of printed wiring board 79 consisting of a copper-clad glass epoxy resin of a thickness, e.g., 0.1 mm, thereby mounting each electronic circuit module 80 on printed wiring board 79. Similar to the case wherein spherical electrodes 81 are bonded to electrode terminals 77, this bonding is performed using a hot press unit at a pressure higher than that in the same case. For example, when an alloy consisting of 90 parts by weight of In and 10 parts by weight of Ag is used, bonding is performed at 100° to 150° C. and 100 to 150 kgf/cm². When an alloy consisting of 36 parts by weight of Pb, 36 parts by weight of Sn, 25 parts by weight of In, and 3 parts by weight of Ag is used, bonding is performed at about 120° C. and 100 kgf/cm².

The change in junction resistance of the electronic circuit device manufactured in this manner was 15% or less after the device was left to stand in a constant temperature bath of 120° C. for 1,000 hours.

Figure 10:
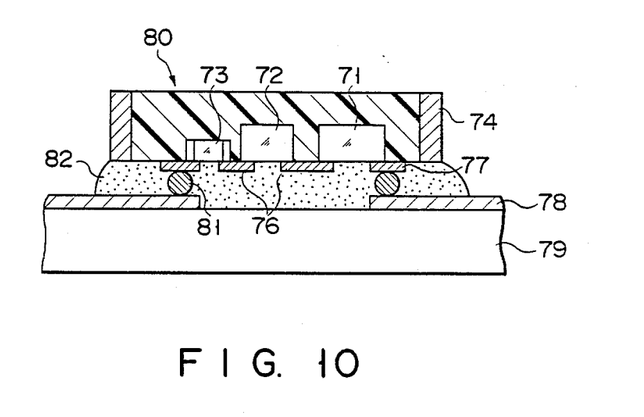
FIG. 10 is a sectional view showing a state wherein junction portions of the device shown in FIG. 9 are resin-sealed.

When or after spherical electrodes 81 bonded to electronic circuit module 80 are bonded to corresponding electrodes 77 of printed wiring board 79, the bonding portions are resin-sealed by potting or the like so that the bonding portions can be covered with sealing resin 82, as shown FIG. 10. In this case, oxidation of electrode terminals 77, spherical electrodes 81 and electrodes 78 is suppressed, and hence the environmental resistance of the electronic circuit device can be improved. Sealing resin 82 can be one or more materials selected from thermosetting resins such as epoxy, phenolic, silicone, polyimide, arcylic, and 1-2 polybutadiene resins, or thermoplastic resins such as polycarbonate, polyvinyl chloride, polyethylene sulfide, and polystyrene resins.

The change in junction resistance of the electronic circuit device resin-sealed in this manner was 30% or less after it was left to stand in a high-temperature and -humidity environment of 60° C. and 90R.H for 1,000 hours, and hence the device exhibited stable characteristics.

According to the electronic circuit device described above, since electrode terminals of an electronic circuit module and electrodes on a printed board can be connected using spherical electrodes in 1:1:1 correspondence, connection reliability can be significantly increased compared with the conventional method of using an anisotropic conductive adhesive sheet. Especially, by using metal balls having a uniform diameter as spherical electrodes, a junction resistance can be easily made uniform, thereby minimizing breakage of electrode terminals and electrodes.

In the above-described embodiments, metal balls are used as the ones to be formed into the bump electrodes or the spherical electrodes. However, the shape of the metal balls need not be a perfect sphere, but any shape may be used as long as it is a particulate shape.

What is claimed is:

1. A method of forming a bump electrode on an electrode terminal of an electronic component, comprising the steps of:
    preparing a support having a recess formed in a surface portion thereof, at a position corresponding to said electrode terminal of said electronic component;
    electrically charging said recess of said support, to create static electricity in said recess;
    placing a particulate metal member in said recess, said metal member being retained therein by way of said static electricity; and
    bonding said electrode terminal to said particulate metal member while said electronic component is opposed to said support.

2. A method according to claim 1, wherein said support comprises a base, a resin layer which is formed on said base and has said recess formed on a surface thereof, and a conductive layer formed on a portion of a surface of said resin layer other than said recess.

3. A method according to claim 2, wherein said base, said resin layer, and said conductive layer are transparent.

4. A method according to claim 3, wherein said conductive layer consists of indium oxide, tin oxide, or a composite oxide thereof.

5. A method according to claim 2, wherein an area of an opening of said recess is larger than an area of a bottom portion thereof.

6. A method according to claim 1, wherein said particulate member is spherical in shape.

7. A method according to claim 1, wherein the step of electrically charging said recess of said support is performed by a corona discharge.

8. A method according to claim 1, wherein said particulate metal member comprises at least one substance selected from the group consisting of Ag, Au, Al, Cu, Ni, Sn, Pb, In, Sb, Zn, Bi, and Cd.

9. A method according to claim 8, wherein said particulate metal member comprises In or an alloy containing In.

10. A method according to claim 1, wherein the step of bonding said particulate metal member to said electrode terminal is performed by use of a hot press unit.

11. A method of forming a bump electrode on an electrode terminal of an electronic component including a semiconductor element, comprising the steps of:
    preparing a support having a recess formed in a surface portion thereof, at a position corresponding to said electrode terminal of said electronic part;
    electrically charging said recess of said support, to create static electricity in said recess;
    placing a particulate metal member in said recess, said metal member being retained by way of said static electricity;
    eliminating a charge held wihin said particulate metal member; and
    bonding said electrode terminal to said particulate metal member while said electronic component is opposed to said support.

12. A method according to claim 11, wherein the step of eliminating the charge is accomplished by ion blowing.

13. A method according to claim 11, wherein said support has a photoconductive layer formed on a surface of said recess, and the step of eliminating the charge is accomplished by irradiating said photoconductive layer with light.

14. A method of forming a bump electrode on an electrode terminal of an electronic component, comprising the steps of:
    preparing a support having a photoconductive layer formed on a surface portion thereof;
    electrically charging a surface of said photoconductive layer;
    exposing to light an area on the surface of said photoconductive layer, other than an area corresponding to said electrode terminal, to eliminate a charge held in the exposed area;

placing a particulate metal member on a non-exposed area of the surface of said photoconductive layer, said metal member being retained thereon by way of the static electricity; and bonding said electrode terminal to said particulate metal member while said electronic component is opposed to said support.

15. A method according to claim 14, wherein said photoconductive layer comprises a material selected from the group consisting of amorphous silicon, selenium, cadmium sulfide, and polyvinylcarbazole.

16. A method of manufacturing an electronic circuit device, comprising the steps of:

preparing an electronic circuit module having a plurality of electronic parts including a semiconductor element buried in a resin, and electrode terminals formed of a conductive paste and formed on each of electronic component;

preparing a support having a recess formed on a surface portion thereof, at a position corresponding to said electrode terminal of said electronic circuit module;

electrically charging said recess of said support, to create static electricity in said recess;

placing a particulate metal member in said recess, said metal member being retained therein by way of said static electricity;

bonding said electrode terminal to said particulate metal member while said electronic circuit module is opposed to said support; and bonding said particulate metal member to an electrode of a printed wiring board to mount said electronic circuit module on said printed wiring board.

* * * * *